United States Patent
Watanabe et al.

(10) Patent No.: US 12,295,121 B2
(45) Date of Patent: May 6, 2025

(54) HEAT SINK

(71) Applicant: Furukawa Electric Co., Ltd., Tokyo (JP)

(72) Inventors: Yosuke Watanabe, Tokyo (JP); Hirofumi Aoki, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 18/426,022

(22) Filed: Jan. 29, 2024

(65) Prior Publication Data

US 2024/0260234 A1    Aug. 1, 2024

(30) Foreign Application Priority Data

Jan. 30, 2023   (JP) .................................. 2023-011820

(51) Int. Cl.
*H05K 7/20* (2006.01)

(52) U.S. Cl.
CPC .................................. *H05K 7/2039* (2013.01)

(58) Field of Classification Search
CPC .... H05K 7/2039; H05K 7/20336; H05K 7/20; F28D 15/04; F28D 15/02
See application file for complete search history.

(56) References Cited

U.S. PATENT DOCUMENTS

| | | | | |
|---|---|---|---|---|
| 2009/0173475 A1* | 7/2009 | Hsiao | ................... | F28D 15/046 165/104.33 |
| 2018/0172360 A1* | 6/2018 | Miura | ................... | H01L 23/427 |
| 2020/0018555 A1 | 1/2020 | Lin | | |
| 2020/0141659 A1* | 5/2020 | Inagaki | ................... | F28F 21/08 |
| 2020/0173730 A1* | 6/2020 | Watanabe | ................ | F28F 9/22 |
| 2020/0173731 A1* | 6/2020 | Kawabata | ............... | F28D 15/04 |

FOREIGN PATENT DOCUMENTS

| | | |
|---|---|---|
| JP | 2013195001 A | 9/2013 |
| JP | 2020085426 A | 6/2020 |

OTHER PUBLICATIONS

[English Translation] Notice of Reasons for Refusal for Japanese Patent Application No. 2023-011820 dated Mar. 14, 2023, pp. all.

* cited by examiner

*Primary Examiner* — Gordon A Jones
(74) *Attorney, Agent, or Firm* — Dorsey & Whitney LLP

(57) ABSTRACT

The heat sink includes a heat transport member having an evaporation portion to be thermally connected to a heat-generating element, a tube body which is connected to a connection portion located in a condensation portion of the heat transport member, and a heat radiation fin group which is thermally connected to the tube body, in which the heat transport member has an integral internal space, the internal space of the heat transport member communicates with an internal space of the tube body via the connection portion, the tube body has a circular portion in which a shape in a radial direction is a circular shape, and a flat portion in which a shape in the radial direction is a flat shape, the circular portion is located in the connection portion, and the flat portion is located in a part to which the heat radiation fin group is thermally connected.

22 Claims, 10 Drawing Sheets

HEAT SINK

CROSS REFERENCE TO RELATED APPLICATIONS

This application claims the benefit of Japanese Patent Application No. 2023-011820, filed Jan. 30, 2023, which is hereby incorporated by reference in its entirety.

BACKGROUND

Technical Field

The present disclosure relates to a heat sink that cools heat-generating elements such as electrical and electronic components that are placed on substrates such as electronic circuit boards, and more particularly, to a heat sink that is excellent in flow characteristics of a gas-phase working fluid, and can prevent leakage of the gas-phase working fluid.

Background

As electronic devices become more sophisticated, a large number of components including heat-generating elements such as electronic components, are placed on substrates such as electronic circuit boards inside the electronic devices. In addition, as electronic devices become more sophisticated, heat generation amounts of the heat-generating elements such as electronic components are increasing. There is a case where heat transport members such as a vapor chamber, a heat pipe and a heat sink are used as units configured to cool the heat-generating elements, such as electronic components.

Meanwhile, in recent years, since a large number of components have been placed with increasingly higher density, inside electronic devices, the installation spaces for heat sinks may be limited to narrow spaces. Moreover, a heat generation amount from the electronic component increases, and therefore, the heat sink is required to save space and improve the cooling performance more.

Thus, as the heat transport member that cools a heat-generating element such as an electronic component, there is proposed a vapor chamber in which a wick structure and a working fluid are accommodated, and which is the vapor chamber including a first section, a second section extending in a direction to be away from the first section from one end of the first section, a fourth section extending in a left-right direction from the second section, a third section extending in a direction to be away from the first section from one end of the first section, and a fifth section extending in a left-right direction from the third section, in which the wick structure extends throughout all of the first section to the fifth section (Specification of U.S. Patent Application Publication No. 2020/0018555).

In the Specification of U.S. Patent Application Publication No. 2020/0018555, the heat-generating element is cooled while the space is saved, by transporting the heat of the heat-generating element thermally connected to the first section to the fourth section and the fifth section that are condensation portions extending in the left-right direction via the second section and the third section that extend from the one end of the first section that is an evaporation portion.

However, in the Specification of U.S. Patent Application Publication No. 2020/0018555, due to space-saving, in particular, space-saving in a thickness direction, the entire body has a flat shape throughout the first section to the fifth section, and therefore flow characteristics of the gas-phase working fluid are deteriorated particularly in the connection portions of the respective sections.

If the number of the fourth sections and the fifth sections as the condensation portion installed is increased in the limited space to further improve the cooling performance of the heat transport member, the intervals of the sections forming the condensation portion become narrow, and the sections forming the condensation portion may contact each other and cause cracking. If cracking occurs to the sections forming the condensation portion, leakage of the gas-phase working fluid occurs from the cracking.

SUMMARY

The present disclosure is related to providing a heat sink that is excellent in flow characteristics of a gas-phase working fluid and cooling performance while saving space, and can prevent leakage of the gas-phase working fluid.

The gist of the configuration of the heat sink of the present disclosure is as follows.

{1} A heat sink including a heat transport member having an evaporation portion to be thermally connected to a heat-generating element, a tube body which is connected to a connection portion located in a condensation portion of the heat transport member and has a heat transport direction different from a heat transport direction of the heat transport member, and a heat radiation fin group which is thermally connected to the tube body and in which a plurality of heat radiation fins are arranged, in which the heat transport member has an integral internal space which communicates from the evaporation portion to the connection portion with the tube body and in which a working fluid is sealed, and the internal space of the heat transport member communicates with an internal space of the tube body via the connection portion, the tube body has a circular portion in which a shape in a radial direction is a circular shape, and a flat portion in which a shape in the radial direction is a flat shape, the circular portion is located in the connection portion, and the flat portion is located in a part to which the heat radiation fin group is thermally connected.

{2} The heat sink according to {1}, in which a first wick structure extending from the evaporation portion to the condensation portion is provided in the internal space of the heat transport member, and a second wick structure is provided inside the tube body.

{3} The heat sink according to {2}, in which the first wick structure is connected to the second wick structure via a connection member located in the connection portion.

{4} The heat sink according to {3}, in which the connection member is a wick member having a capillary force.

{5} The heat sink according to any one of {1} to {4}, in which the tube body has an inclined portion that inclines from the flat portion to the circular portion, between the circular portion and the flat portion.

{6} The heat sink according to any one of {1} to {4}, in which the heat transport member is a planar type that extends on a same plane.

{7} The heat sink according to any one of {1} to {4}, in which the heat transport member has a heat radiation side step portion provided with a step in a direction that is not a direction parallel to the heat transport direction of the heat transport member, between a heat insulating portion located between the evaporation portion and the condensation portion, and the condensation portion.

{8} The heat sink according to any one of {1} to {4}, in which the heat transport member has a heat receiving side step portion provided with a step in a direction that is not a direction parallel to the heat transport direction of the heat transport member, between the evaporation portion and the heat insulating portion.

{9} The heat sink according to any one of {1} to {4}, in which the tube body extends along an arrangement direction of the plurality of heat radiation fins.

{10} The heat sink according to any one of {1} to {4}, in which a plurality of the tube bodies are provided and extend in a plurality of directions from the heat transport member.

In the above-described aspect, in the heat transport member, the part to be thermally connected to the heat-generating element which is an object to be cooled functions as the evaporation portion (heat receiving portion), and the part connected to the tube body functions as the condensation portion (heat radiating portion) of the heat transport member. In the evaporation portion of the heat transport member, the working fluid receives heat from the heat-generating element and changes in phase from a liquid phase to a gas phase, and in the condensation portion of the heat transport member, a part of the gas-phase working fluid releases latent heat to change in phase from the gas phase to the liquid phase. In the aspect of the heat sink of the present disclosure, the heat of the heat-generating element is transported from the evaporation portion of the heat transport member to the condensation portion of the heat transport member by the heat transport member, and further transported from the condensation portion of the heat transport member to the tube body. The working fluid that has changed in phase to the gas phase as a result of the heat transport member receiving heat from the heat-generating element flows from the heat transport member to the tube body via the connection portion. As a result of the gas-phase working fluid flowing from the heat transport member to the tube body, the tube body receives heat from the heat transport member, and further transfers the heat received from the heat transport member to the heat radiation fin group thermally connected to the tube body. When the tube body transfers the heat received from the heat transport member to the heat radiation fin group, the gas-phase working fluid flowing from the heat transport member to the tube body changes in phase to the liquid phase. The heat transferred from the tube body to the heat radiation fin group is released to the external environment of the heat sink from the heat radiation fin group.

In the above-described aspect, the heat transport direction of the heat transport member and the heat transport direction of the tube body differ from each other, and therefore, the extending direction of the heat transport member and the extending direction of the tube body differ from each other.

According to an aspect of the heat sink of the present disclosure, since the tube body has the circular portion in which the shape in the radial direction is a circular shape, and the flat portion in which the shape in the radial direction is a flat shape, and the circular portion is located in the connection portion with the heat transport member, pressure loss of the gas-phase working fluid in the connection portion is reduced, and therefore the flow characteristics of the gas-phase working fluid are excellent. Since the shape in the radial direction of the tube body in the connection portion is a circular shape, the intervals among the tube bodies can be sufficiently ensured in the base portion of the tube bodies located in the connection portion, even when the number of tube bodies installed is increased to improve cooling characteristics, and therefore, it is possible to prevent cracking from occurring to the heat transport member in the part between the tube body and the tube body due to contact or the like of the tube body and the heat transport member, while obtaining excellent cooling performance. Since cracking can be prevented from occurring to the heat transport member, the joining material such as solder that joins the tube body to the heat transport member can be prevented from entering the internal spaces of the tube body and the heat transport member from cracking, and as a result, it is possible to prevent the capillary force from being reduced by the joining material such as solder being absorbed by the members that are provided in the internal spaces of the tube body and the heat transport member and have the capillary force. Since it is possible to prevent cracking from occurring to the heat transport member, leakage of the gas-phase working fluid can be prevented. According to the aspect of the heat sink of the present disclosure, the flat portion is located in the part to which the heat radiation fin group is thermally connected, and therefore, space of the heat sink can be saved.

In an aspect of the heat sink of the present disclosure, the internal space of the heat transport member having the evaporation portion is integrated entirely in a communicating manner, unlike the internal space of a heat pipe group in which a plurality of heat pipes are arranged side by side. From the above, in the aspect of the heat sink of the present disclosure in which the heat transport member where the internal space is integrated transports the heat of the heat-generating element from the evaporation portion to the connection portion with the tube body which is thermally connected to the heat radiation fin, the flow characteristics of the working fluid are excellent. In addition, even when the heat generation amount from the heat-generating element increases, the heat inputted in the evaporation portion can be equalized, and thermal resistance in the evaporation portion can be reduced. Further, in the aspect of the heat sink of the present disclosure, the internal space of the heat transport member is integrated entirely in a communicating manner, and therefore even when uneven heat generation occurs to the heat-generating element, the entire heat-generating element can be uniformly cooled.

In an aspect of the heat sink of the present disclosure, since the tube body has the heat transport direction different from the heat transport direction of the heat transport member, increase in the dimension of the heat sink can be prevented with respect to the extending direction (heat transport direction) of the heat transport member, and as a result, space can be saved.

According to an aspect of the heat sink of the present disclosure, the first wick structure extending from the evaporation portion to the condensation portion is provided in the internal space of the heat transport member, and the second wick structure is provided inside the tube body. Therefore, the working fluid that has changed in phase from the gas phase to the liquid phase in the internal space of the tube body can smoothly circulate to the evaporation portion of the heat transport member.

According to an aspect of the heat sink of the present disclosure, the first wick structure is connected to the second wick structure via the connection member located in the connection portion, and therefore, the liquid-phase working fluid is smoothly circulated from the second wick structure to the first wick structure.

According to an aspect of the heat sink of the present disclosure, since the tube body has the inclined portion that inclines from the flat portion to the circular portion between the circular portion and the flat portion, the liquid-phase working fluid circulates more smoothly from the tube body to the heat transport member, and circulation characteristics of the liquid-phase working fluid from the tube body to the heat transport member are further improved.

According to an aspect of the heat sink of the present disclosure, the heat transport member is a planar type that extends on the same plane, and therefore, space of the heat transport member is saved, in particular, space is saved in the thickness direction of the heat transport member.

According to an aspect of the heat sink of the present disclosure, the heat transport member has the heat radiation side step portion provided with the step in the direction that is not the direction parallel to the heat transport direction of the heat transport member, between the heat insulating portion and the condensation portion, and therefore, even when a forbidden region exists in the installation space in the vicinity of the condensation portion, the heat sink can be installed, under the environment where the installation space for the heat sink is limited.

According to an aspect of the heat sink of the present disclosure, the heat transport member has the heat receiving side step portion provided with the step in the direction that is not the direction parallel to the heat transport direction of the heat transport member, between the evaporation portion and the heat insulating portion, and therefore, even when the forbidden region exists in the installation space in the vicinity of the evaporation portion, the heat sink can be installed, under the environment where the installation space for the heat sink is limited.

According to an aspect of the heat sink of the present disclosure, a plurality of the tube bodies are provided, and extend in a plurality of directions from the heat transport member, and therefore, the heat transported from the heat transport member to the tube bodies are transported to the plurality of directions different from the extending direction (heat transport direction) of the heat transport member. Accordingly, increase in the dimension of the heat sink can be prevented more reliably with respect to the extending direction (heat transport direction) of the heat transport member.

DETAILED DESCRIPTION

Figure 1:
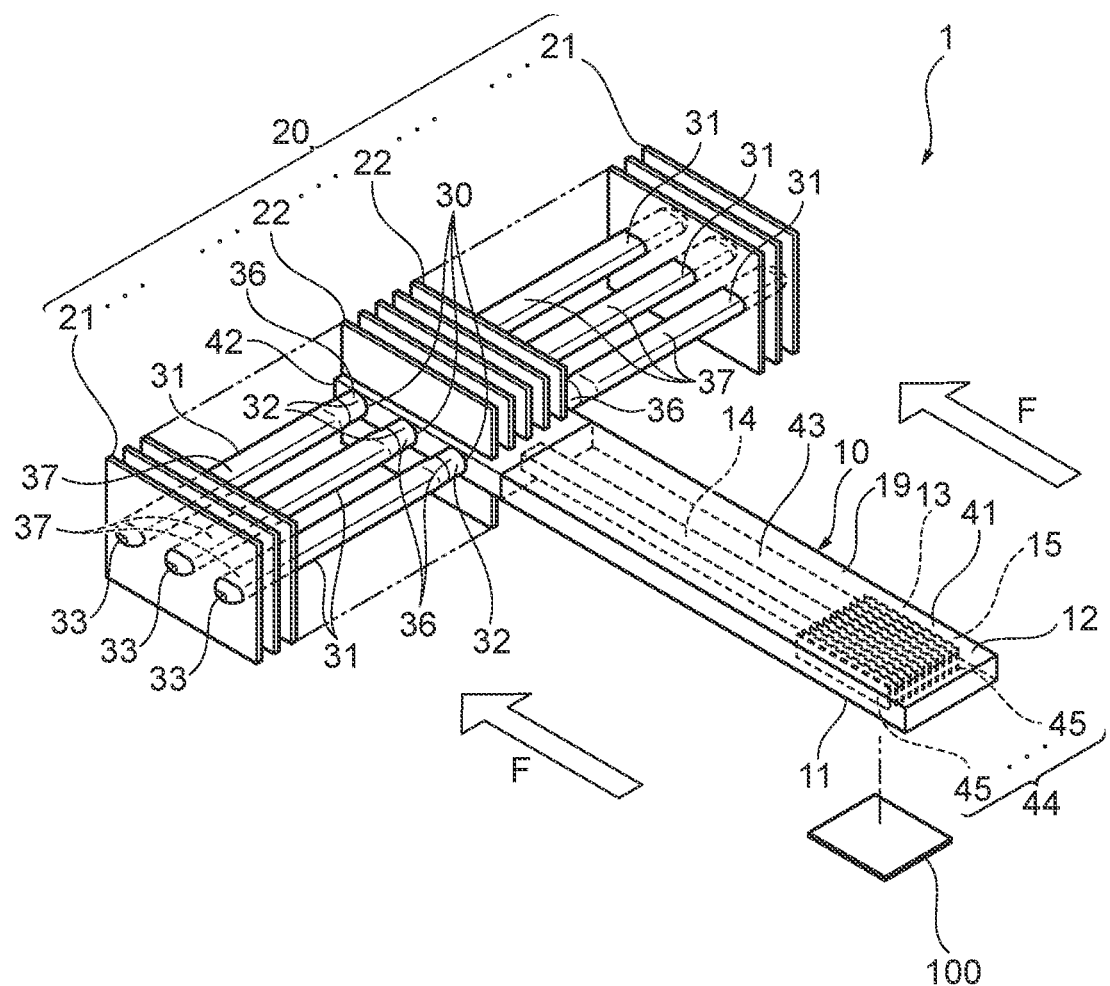
FIG. 1 is a perspective view explaining an outline of a heat sink according to a first embodiment of the present disclosure.
Figure 2:
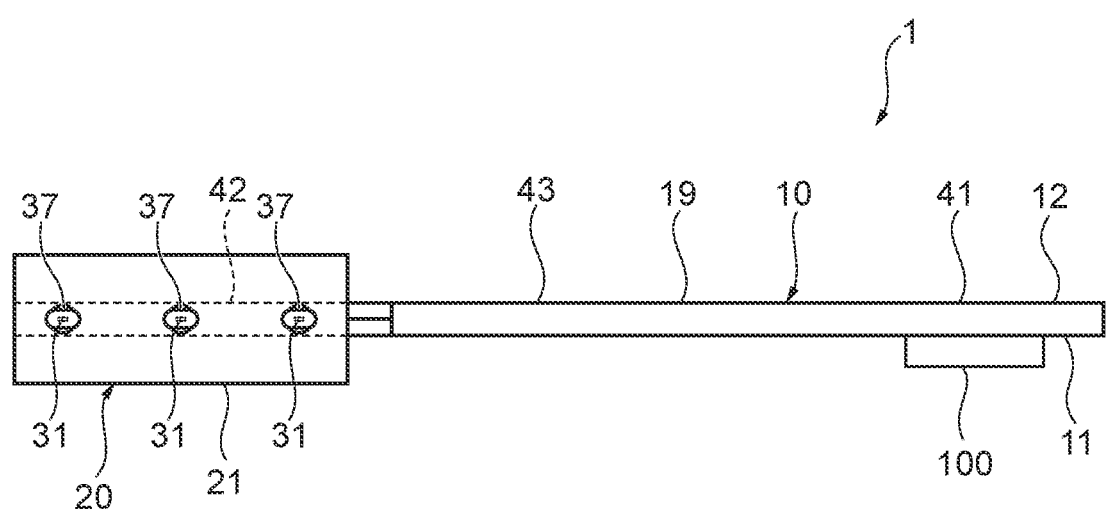
FIG. 2 is a side view explaining an outline of the heat sink according to the first embodiment of the present disclosure.
Figure 3:
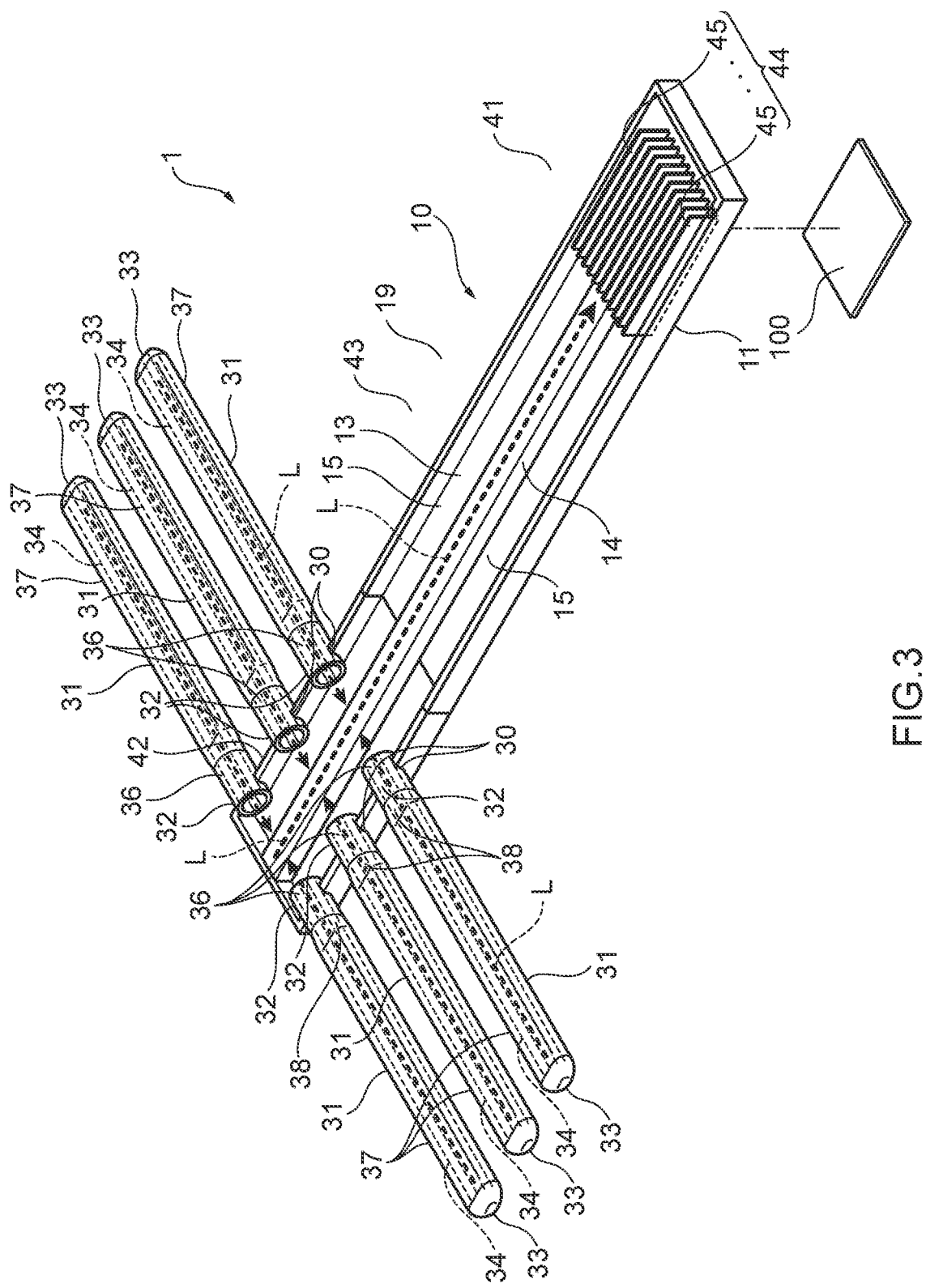
FIG. 3 is a perspective view explaining an outline of an inside of the heat sink according to the first embodiment of the present disclosure.
Figure 4:
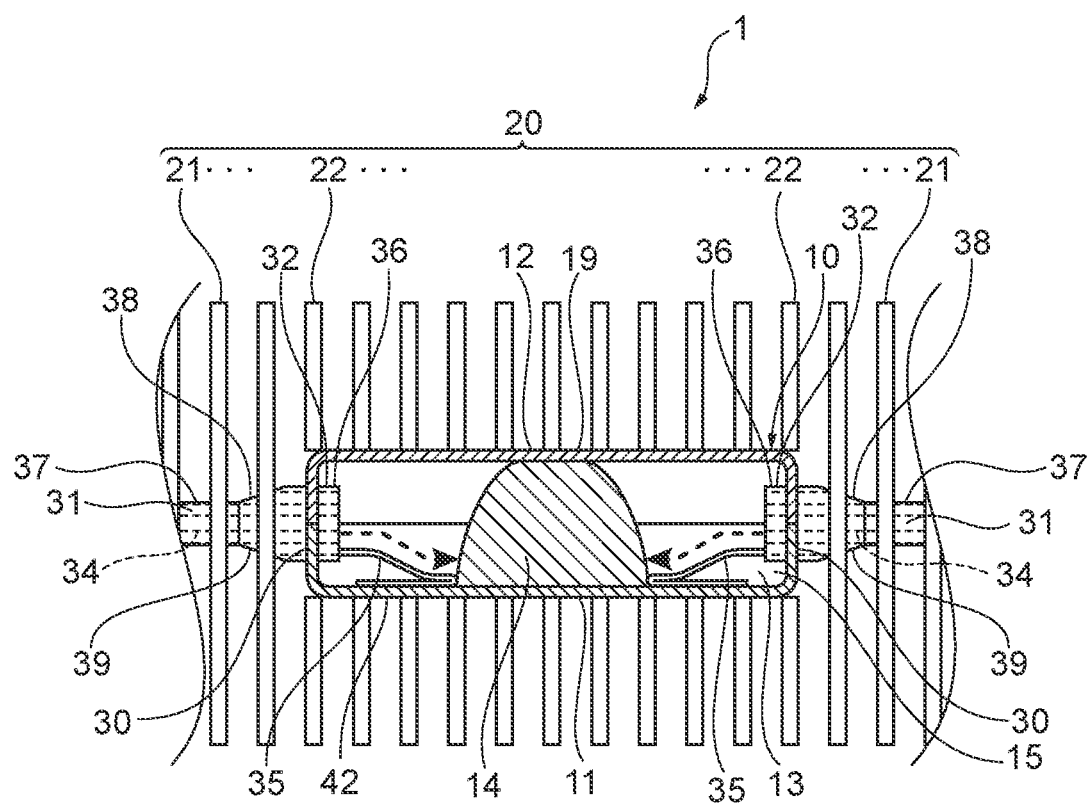
FIG. 4 is an explanatory view illustrating an outline of a connection portion between a heat transport member and a tube body of the heat sink according to the first embodiment of the present disclosure.
Figure 5:
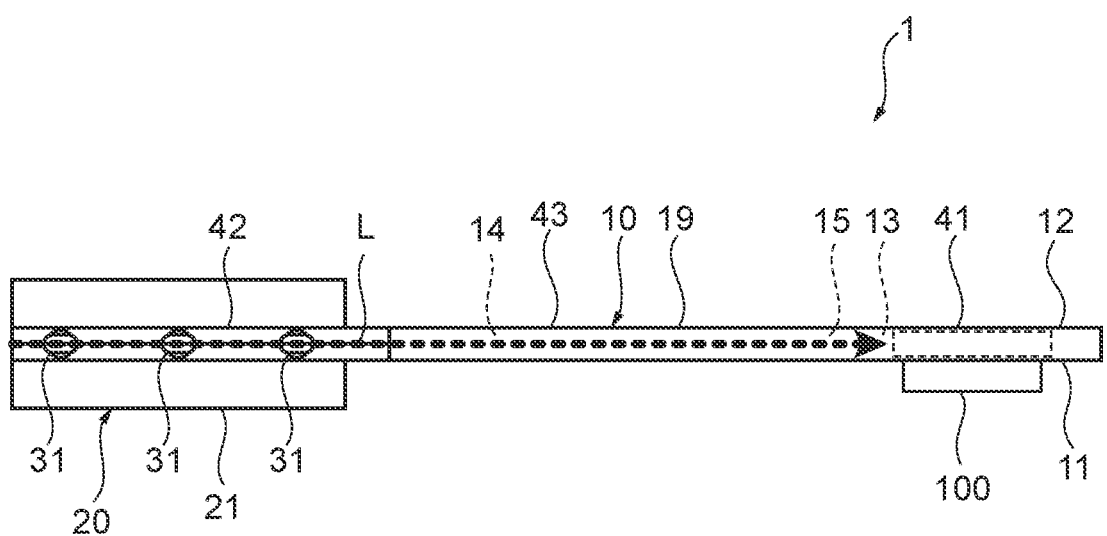
FIG. 5 is a side view explaining the outline of the inside of the heat sink according to the first embodiment of the present disclosure.

Hereinafter, heat sinks according to embodiments of the present disclosure will be described with reference to the drawings. First, a heat sink according to a first embodiment of the present disclosure will be described. FIG. 1 is a perspective view explaining an outline of the heat sink according to the first embodiment of the present disclosure. FIG. 2 is a side view explaining the outline of the heat sink according to the first embodiment of the present disclosure. FIG. 3 is a perspective view explaining an outline of an inside of the heat sink according to the first embodiment of the present disclosure. FIG. 4 is an explanatory view illustrating an outline of a connection portion between a heat transport member and a tube body of the heat sink according to the first embodiment of the present disclosure. FIG. 5 is a side view explaining the outline of the inside of the heat sink according to the first embodiment of the present disclosure.

As illustrated in FIGS. 1 and 2, a heat sink 1 according to the first embodiment of the present disclosure includes a heat transport member 10 having an evaporation portion 41 (in some examples, the evaporation portion 41 may be referred to as heat receiving portion 41) thermally connected to a heat-generating element 100, a tube body 31 that is connected to a connection portion 30 located in a condensation portion 42 (in some examples, the condensation portion 42 may be referred to as heat radiating portion 42) of the heat transport member 10 and each has a heat transport direction different from a heat transport direction of the heat transport member 10, and a heat radiation fin group 20 which is thermally connected to the tube body 31 and in which a plurality of heat radiation fins are arranged. The heat radiation fin group 20 includes a plurality of first heat radiation fins 21, 21, 21 . . . that are attached to the tube body 31, and a plurality of second heat radiation fins 22, 22, 22 . . . that are attached to the heat transport member 10. The tube body 31 is connected to the heat transport member 10 in the condensation portion 42 of the heat transport member 10.

The heat transport member 10 has an integral internal space which communicates from the evaporation portion 41 to the connection portion 30 with the tube body 31 and in which a working fluid is sealed. The internal space of the heat transport member 10 is integrated entirely in a communicating manner, unlike the internal space of the heat pipe group in which the plurality of heat pipes are arranged in parallel.

The internal space of the heat transport member 10 communicates with an internal space of the tube body 31 via the connection portion 30. In other words, in the heat sink 1, the internal space of the heat transport member 10 and the internal space of the tube body 31 are integrated in a communicating manner, and the working fluid is sealed in the internal spaces that are integrated.

As illustrated in FIGS. 1 and 2, the heat transport member 10 has a container 19 having a hollow cavity portion 13, and a working fluid (not illustrated) that flows through the cavity portion 13. In the cavity portion 13, a first wick structure 14 having a capillary force and extending from the evaporation portion 41 to the condensation portion 42 is provided. The container 19 is formed by stacking one plate-shaped body 11 located on an installation surface side of the heat sink 1 and another plate-shaped body 12 that faces the one plate-shaped body 11 on each other.

The one plate-shaped body 11 has a plate shape having side walls erected from a plane portion at edge portions of the plane portion. The other plate-shaped body 12 also has a plate shape having side walls erected from a plane portion at edge portions of the plane portion. Therefore, the one plate-shaped body 11 and the other plate-shaped body 12 each have a recessed shape. By stacking the one plate-shaped body 11 and the other plate-shaped body 12 on each other in a state where the recessed shapes are faced to each other, the cavity portion 13 of the container 19 is formed. The container 19 extends on a same plane. From the above, the heat transport member 10 is a planar type that extends on the same plane. The cavity portion 13 of the container 19 is an internal space sealed with respect to the external environment and is decompressed by deaeration processing.

On the outer surface of the container 19, a part to which the heat-generating element 100 which is an object to be cooled is thermally connected functions as the evaporation portion 41. The heat-generating element 100 is thermally connected to the container 19, and accordingly, the heat-generating element 100 is cooled. In the heat transport member 10, since the heat-generating element 100 is thermally connected to one end, the evaporation portion 41 is formed at the one end. Further, on an inner surface of the container 19, a heat receiving portion inner surface area increasing portion 44 is provided in the evaporation portion 41. The heat receiving portion inner surface area increasing portion 44 is a part where unevenness is repeatedly formed, and in the heat sink 1, a plurality of plate-shaped fins 45, 45 . . . are erected on the inner surface of the one plate-shaped body 11. Since the heat receiving portion inner surface area increasing portion 44 is provided in the evaporation portion 41, heat transfer from the evaporation portion 41 to the liquid-phase working fluid is made smooth. The heat receiving portion inner surface area increasing portion 44 does not have to be provided according to usage condition or the like of the heat sink 1.

The heat transport member 10 extends in a predetermined direction from the position of the heat-generating element 100, and the plurality of second heat radiation fins 22, 22, 22 . . . that form the heat radiation fin group 20 are thermally connected to the other end that faces the one end. The other end of the heat transport member 10 to which the heat radiation fin group 20 is thermally connected functions as the condensation portion 42 of the heat transport member 10.

In the heat transport member 10, a middle portion that is located between the evaporation portion 41 located at one end of the container 19 and the condensation portion 42 located at another end of the container 19 functions as a heat insulating portion 43. The heat insulating portion 43 is a part to which neither the heat radiation fin group 20 nor the heat-generating element 100 is thermally connected. Therefore, the heat insulating portion 43 is a part where heat is not actively received or radiated. The heat transferred from the heat-generating element 100 to the evaporation portion 41 is transported from the evaporation portion 41 to the condensation portion 42 along the extending direction of the heat insulating portion 43.

A dimension in a width direction of the heat transport member 10 is not particularly limited, and in the heat sink 1, the evaporation portion 41, the heat insulating portion 43 and the condensation portion 42 have substantially same dimensions, for convenience of explanation. A dimension in the width direction of the heat transport member 10 in the evaporation portion 41 can be appropriately selected according to a dimension in a width direction of the heat-generating element 100 or the like.

As illustrated in FIGS. 1 and 3, the first wick structure 14 extends from the evaporation portion 41 of the container 19 to the condensation portion 42, in a center portion in the width direction of the heat transport member 10. The first wick structure 14 extends on a same plane correspondingly to the container 19 that extends on the same plane.

A configuration of the first wick structure 14 is not particularly limited, and examples thereof include sintered bodies of metal powder such as copper powder, metal meshes made of a metal wire, grooves (for example, a plurality of fine grooves), nonwoven fabric, metal fibers and the like. In the heat transport member 10, a sintered body of metal powder is used as the first wick structure 14. Of the cavity portion 13, a part where the first wick structure 14 is not provided functions as a steam flow path 15 through which a gas-phase working fluid flows. The steam flow path 15 extends from the evaporation portion 41 of the heat transport member 10 (for example, container 19) to the condensation portion 42 correspondingly to the first wick structure 14 that extends from the evaporation portion 41 of the heat transport member 10 (for example, container 19) to the condensation portion 42. The heat transport member 10 transports the heat of the heat-generating element 100 received in the evaporation portion 41 from the evaporation portion 41 to the condensation portion 42 according to the heat transport characteristics by the operation of the working fluid.

As illustrated in FIGS. 1 to 3, a plurality of tube bodies 31, 31, 31 . . . the internal spaces of which communicate with the cavity portion 13 of the container 19 are provided at the other end of the heat transport member 10. The internal space of the tube body 31 communicates with the cavity portion 13 of the heat transport member 10 via the connection portion 30. Therefore, the working fluid flowing through the cavity portion 13 is sealed in a space from the cavity portion 13 to an inside of the tube body 31.

In the heat sink 1, the tube body 31 has a circular portion 36 in which a shape in a direction (for example, radial direction) orthogonal to a longitudinal direction is a circular shape, and a flat portion 37 in which a shape in a direction (for example, radial direction) orthogonal to the longitudinal direction is a flat shape. Examples of a shape of the flat portion 37 include an elliptical shape, a rounded rectangle, and the like. Further, the flat portion 37 has a flat shape (that is, horizontal flat) along the extending direction of the heat transport member 10. The flat portion 37 can be formed by flattening a part in which the shape in the radial direction is a circular shape. The circular portion 36 of the tube body 31 is located in the connection portion 30 with the heat transport member 10, and the flat portion 37 of the tube body 31 is located in a part to which the plurality of heat radiation fins 21, 21, 21 . . . are thermally connected.

The tube body 31 has a boundary portion 38 between the circular portion 36 and the flat portion 37. A shape in the radial direction of the boundary portion 38 is not a circular shape or a flat shape, but a shape of a process of changing from the circular shape to the flat shape. From the above, the tube body 31 has the circular portion 36, the boundary portion 38, and the flat portion 37 in order from the connection portion 30 along the longitudinal direction. Further, internal spaces of the circular portion 36, the boundary portion 38, and the flat portion 37 communicate with one another, and the working fluid can flow through the internal spaces.

In the heat sink 1, the plurality of tube bodies 31, 31, 31 . . . each have a structure that has the circular portion 36 in which the shape in the radial direction is a circular shape and the flat portion 37 in which the shape in the radial direction is a flat shape. From the above, the interval between the tube bodies 31 adjacent to each other is wider in the connection portion 30 of the tube bodies 31 with the heat transport member 10 than in the part to which the plurality of heat radiation fins 21, 21, 21 . . . are thermally connected.

As illustrated in FIG. 4, in the tube body 31, a portion between the circular portion 36 and the flat portion 37 is an inclined portion 39 that inclines from the flat portion 37 to the circular portion 36. The inclined portion 39 inclines in a direction to the installation surface of the heat sink 1. In the heat sink 1, the boundary portion 38 is the inclined portion 39 that inclines in a slope shape along the longitudinal direction of the tube body 31.

In the internal space of the tube body 31, a ratio of a diameter of the circular portion 36 and a thickness of the flat portion 37 is not particularly limited, and can be appropriately selected according to the usage condition or the like of the heat sink 1. In the internal space of the tube body 31, the ratio of the thickness of the flat portion 37 to the diameter of the circular portion 36 is preferably 0.30 or more and 0.90 or less, and particularly preferably 0.50 or more and 0.80 or less, for example. The shape in the longitudinal direction of the tube body 31 is not particularly limited and is substantially rectilinear in the heat sink 1. All the tube bodies 31 have substantially same shapes and dimensions.

In the heat sink 1, the tube body 31 extends in a substantially orthogonal direction to the heat transport direction of the heat transport member 10 along a plane direction of the condensation portion 42 of the heat transport member 10. Since the extending direction of the tube body 31 is not parallel to the heat transport direction of the heat transport member 10, the tube body 31 has a heat transport direction different from the heat transport direction of the heat transport member 10. The heat transported from the evaporation portion 41 to the condensation portion 42 in the heat transport member 10 is transported to a direction different from the extending direction of the heat transport member 10 by the tube body 31. Accordingly, since increase in the dimension of the heat sink 1 in the extending direction (for example, heat transport direction) of the heat transport member 10 can be prevented, space for the heat sink 1 can be saved.

A plurality of tube bodies 31 are provided and extend in a plurality of directions from the condensation portion 42 of the heat transport member 10. In the heat sink 1, the tube bodies 31 extend in both left and right directions, that is, two directions, with the heat transport member 10 as a center. Same numbers of tube bodies 31 are provided in both the left and right directions with the heat transport member 10 as the center. Since the plurality of tube bodies 31, 31, 31 . . . extend in the plurality of directions (for example, two directions in the heat sink 1) from the heat transport member 10, the heat transported from the heat transport member 10 to the tube bodies 31 is branched into the plurality of directions (for example, two directions in the heat sink 1) different from the extending direction (for example, heat transport direction) of the heat transport member 10 and transported. Accordingly, increase in the dimension of the heat sink 1 in the extending direction (for example, heat transport direction) of the heat transport member 10 can be prevented more reliably.

As illustrated in FIGS. 1 to 4, an end portion (hereinafter, also referred to as "base portion") 32 on the side of the heat transport member 10, of the tube body 31 is located in the connection portion 30 and opened. The opened base portion 32 forms the circular portion 36. Meanwhile, an end portion (hereinafter, also referred to as "tip end portion") 33 opposite to the heat transport member 10 is closed. The closed tip end portion 33 forms the flat portion 37. In addition, the cavity portion 13 of the container 19 and the internal space of the tube body 31 communicate with each other, and the internal space of the tube body 31 is depressurized by the deaeration processing in the same manner as the cavity portion 13. Accordingly, the working fluid can flow between the cavity portion 13 of the container 19 and the internal space of the tube body 31.

A through hole (not illustrated) for attaching the tube body 31 to the container 19 is formed in the side surface portion of the container 19. The shape and dimension of the through hole correspond to the shape and dimension of the base portion 32 of the tube body 31, the base portion 32 of the tube body 31 is fitted and inserted into the through hole of the container 19, and accordingly, the tube body 31 is connected to the container 19. Therefore, the tube body 31 and the container 19 are made of different members. A method for fixing the tube body 31 attached to the container 19 is not particularly limited, and examples thereof include joining by means of a joining material such as solder.

In the heat sink 1, since the tube body 31 and the heat transport member 10 are made of different members, the arrangement, dimensions and the like of the tube body 31 can be freely selected, and the degree of freedom in designing the heat sink 1 is improved. Further, in the heat sink 1, since the tube body 31 can be attached to the container 19 by fitting and inserting the tube body 31 into the through hole of the container 19, the assembly is easy.

As illustrated in FIGS. 3 and 4, a second wick structure 34 that is different from the first wick structure 14 provided in the container 19 and has a capillary force is provided inside the tube body 31. As a result that the first wick structure 14 extending from the evaporation portion 41 to the condensation portion 42 is provided in the heat transport member 10, and the second wick structure 34 is provided inside the tube body 31, the working fluid that has changed in phase from the gas phase to the liquid phase in the internal space of the tube body 31 can smoothly circulate to the evaporation portion 41 of the heat transport member 10. Although the second wick structure 34 is not particularly limited, for example, a sintered body of metal powders, such as copper powder, a metal mesh formed of metal wires, a groove, a nonwoven fabric, a metal fiber, and the like can be employed. In the tube body 31, a plurality of fine grooves are formed so as to cover the entire inner surface of the tube body 31 as the second wick structure 34. The fine groove extends along the longitudinal direction of the tube body 31.

As illustrated in FIG. 4, the first wick structure 14 provided in the heat transport member 10 may be connected to the second wick structure 34 provided in the tube body 31 via a connection member 35 positioned in the connection portion 30. The working fluid that has changed in phase from the gas phase to the liquid phase inside the tube body 31 circulates from the tip end portion 33 of the tube body 31 toward the direction of the base portion 32 in the second wick structure 34 by the capillary force of the second wick structure 34 inside the tube body 31, and the liquid-phase working fluid that circulates toward the base portion 32 of the tube body 31 flows from the second wick structure 34 to one end of the connection member 35. The liquid-phase working fluid that has flowed from the second wick structure 34 to the one end of the connection member 35 can flow from the one end to the other end in the connection member 35, and can circulate from the other end of the connection member 35 to the first wick structure 14 of the heat transport member 10.

Accordingly, by providing the connection member 35 in the connection portion 30, the liquid-phase working fluid is smoothly circulated from the second wick structure 34 to the first wick structure 14. From the above, since the flowing performance of the liquid-phase working fluid between the tube body 31 and the heat transport member 10 is improved by the connection member 35, the cooling performance of the heat sink 1 is improved. Examples of the connection member 35 include a wick member having a capillary force, and specifically include a metal mesh, a braided metal wire, a metal fiber and the like.

Examples of the material of the container 19 and the tube body 31 include copper, copper alloy, aluminum, aluminum alloy, nickel, nickel alloy, stainless steel, titanium, titanium alloy and the like. The working fluid sealed in the cavity portion 13 of the container 19 and the internal space of the tube body 31 can be appropriately selected according to the compatibility with the material of the container 19 and the tube body 31, and for example, water, fluorocarbons, hydro fluoroether (HFE), cyclopentane, ethylene glycol, a mixture of these substances, and the like can be given.

The thickness of the container 19 can be appropriately selected from mechanical strength, weight and the like, and for example, can be 0.5 to 3 mm, and the width of the heat transport member 10 can be, for example, 4 to 20 mm. Further, the diameter of the circular portion 36 of the tube body 31 can be appropriately selected from mechanical strength, weight and the like, and for example, can be 5 to 10 mm.

As illustrated in FIGS. 1 to 4, the heat radiation fin group 20 is formed by arranging the plurality of first heat radiation fins 21, 21, 21 . . . and the plurality of second heat radiation fins 22, 22, 22 . . . in parallel respectively. The first heat radiation fins 21 and the second heat radiation fins 22 are both thin flat plate-shaped members. Among these, the first heat radiation fins 21 located at both side portions of the heat radiation fin group 20 are respectively arranged in parallel at predetermined intervals in a direction substantially parallel to the longitudinal direction of the tube body 31. Therefore, the tube body 31 extends along the arrangement direction of the plurality of first heat radiation fins 21, 21, 21 . . . Further, the first heat radiation fins 21 are attached and fixed at the position of the tube body 31 and thermally connected to the tube body 31. The first heat radiation fins 21 all have substantially same shapes and dimensions. The second heat radiation fins 22 located at the center portion of the heat radiation fin group 20 are attached and fixed at the position of the heat transport member 10 and thermally connected to the heat transport member 10. A part of the heat transport member 10 at which the second heat radiation fins 22 are attached functions as the condensation portion 42. The second heat radiation fins 22 are attached so as to be erected on the heat transport member 10.

Main surfaces of the first heat radiation fins 21 are surfaces that mainly exhibit the heat radiation function of the first heat radiation fins 21. The main surfaces of the second heat radiation fins 22 are surfaces that mainly exhibit the heat radiation function of the second heat radiation fins 22. The main surfaces of the first heat radiation fins 21 and the main surfaces of the second heat radiation fins 22 are arranged so as to be in a direction substantially orthogonal to the extending direction, that is, the longitudinal direction of the tube body 31.

The thermal connection method of the first heat radiation fins 21 to the tube body 31 is not particularly limited, and any known method can be used, for example, a method for inserting the tube body 31 into a through hole by forming the through hole (not illustrated) in the first heat radiation fin 21 can be employed. The thermal connection method of the second heat radiation fins 22 to the heat transport member 10 is not particularly limited, and any known method can be used, for example, a method can be employed in which a fixing piece portion extending in a direction perpendicular to the main surface of the heat radiation fin 22 is provided at the end portion of the second heat radiation fin 22, the fixing piece portion is connected to the plane of the heat transport member 10, and the heat radiation fins 22 are erected on the heat transport member 10.

The heat sink 1 is forcibly air-cooled by a blower fan (not illustrated), for example. Cooling air F derived from the blower fan is supplied from a direction substantially parallel to the heat transport direction of the heat transport member 10. The cooling air F is supplied along the main surfaces of the first heat radiation fins 21 and the main surfaces of the second heat radiation fins 22, and the heat radiation fin group 20 is cooled.

The material of the first heat radiation fin 21 and the second heat radiation fin 22 is not particularly limited, and examples thereof include metals, such as copper, copper alloys, aluminum, and aluminum alloys, carbon materials, such as graphite, and composite members using carbon materials.

Thereafter, a mechanism having a cooling function of the heat sink 1 will be described with reference to FIGS. 1, 3 and 5. First, the heat-generating element 100 which is an object to be cooled is thermally connected to one end of the container 19 of the heat transport member 10, and the one end functions as the evaporation portion 41. When the one end of the container 19 receives heat from the heat-generating element 100, the heat is transferred to the liquid-phase working fluid in the cavity portion 13 at the one end of the container 19, and the liquid-phase working fluid is changed in phase to the gas-phase working fluid in the cavity portion 13 at the one end of the container 19. The gas-phase working fluid flows through the steam flow path 15 from the one end of the container 19 to the other end which is the condensation portion 42. As the gas-phase working fluid flows from the one end (evaporation portion 41) of the container 19 to the other end (condensation portion 42), the heat transport member 10 transports the heat from the one end to the other end. A part of the gas-phase working fluid that flows to the other end of the container 19 releases latent heat to change in phase to the liquid-phase working fluid L, and the released latent heat is transferred to the second heat radiation fin 22 thermally connected to the heat transport member 10. The heat transferred to the second heat radiation fins 22 is released to the external environment of the heat sink 1 via the second heat radiation fins 22. The working fluid L that has changed in phase to the liquid phase at the other end of the container 19 circulates to the one end from the other end of the container 19 by the capillary force of the first wick structure 14.

Further, the cavity portion 13 of the container 19 and the internal space of the tube body 31 communicate with each other, and therefore, of the working fluid that has changed in phase from the liquid phase to the gas phase at the one end (for example, the end proximate the evaporation portion 41) of the container 19, the working fluid that has not changed in phase to the liquid phase at the other end (for example, the end proximate the condensation portion 42) of the container 19 flows into the internal space of the tube body 31 from the cavity portion 13. The gas-phase working fluid that has flowed into the internal space of the tube body 31 releases the latent heat inside the tube body 31 and changes in phase into the liquid-phase working fluid L. The latent heat released inside the tube body 31 is transferred to the first heat radiation fin 21 thermally connected to the tube body 31. The heat transferred to the first heat radiation fins 21 is released to the external environment of the heat sink 1 via the first heat radiation fins 21. The working fluid L that has changed in phase from the gas phase to the liquid phase inside the tube body 31 circulates from the center portion and the tip end portion 33 of the tube body 31, which is the flat portion 37 to the base portion 32 of the tube body 31, which is the circular portion 36 by the capillary force of the second wick structure 34 on the inner surface of the tube body 31. The liquid-phase working fluid L that has circulated to the base portion 32 of the tube body 31 circulates to the first wick structure 14 from the base portion 32 of the tube body 31. The liquid-phase working fluid L that has circulated to the first wick structure 14 circulates to the one end of the container 19 from the other end of the container 19 by the capillary force of the first wick structure 14.

In the heat sink 1, since the tube body 31 has the circular portion 36 in which the shape in the radial direction is a circular shape, and the flat portion 37 in which the shape in the radial direction is a flat shape, and the circular portion 36 is located at the connection portion 30 with the heat transport member 10, pressure loss of the gas-phase working fluid in the connection portion 30 is reduced, and the flow characteristics of the gas-phase working fluid are excellent. Further, since the shape in the radial direction of the tube body 31 in the connection portion 30 is a circular shape, the intervals between the tube bodies 31 can be sufficiently ensured in the base portions 32 of the tube bodies 31 located at the connection portions 30, even if the number of tube bodies 31 installed is increased to improve the cooling characteristics of the heat sink 1. Therefore, it is possible to prevent occurrence of cracking in the heat transport member 10 in the part between the tube body 31 and the tube body 31 due to contact or the like of the tube body 31 and the heat transport member 10, for example, contact or the like of the tube body 31 and the heat transport member 10 during operation of attaching the tube body 31 to the heat transport member 10 while obtaining excellent cooling performance. As a result of being able to prevent cracking from occurring to the heat transport member 10, it is possible to prevent the joining material such as solder that fixes the tube body 31 to the heat transport member 10 from entering the internal spaces of the tube body 31 and the heat transport member 10 from cracking. As a result, it is possible to prevent the capillary force from being decreased by the joining material such as solder being absorbed by the member having the capillary force such as the connection member 35 that is provided in the internal spaces of the tube body 31 and the heat transport member 10. Further, since cracking can be prevented from occurring to the heat transport member 10, leakage of the gas-phase working fluid can be prevented. In the heat sink 1, since the flat portion 37 of the tube body 31 is located at the part to which the heat radiation fin group 20 is thermally connected, the space for the heat sink 1 can be saved.

In the heat sink 1, since the heat transport member 10 having the integral internal space transports the heat of the heat-generating element 100 from the evaporation portion 41 to the connection portion 30 with the tube body 31 which is thermally connected to the heat radiation fin group 20, the flow characteristics of the working fluid are excellent. In addition, even when the heat generation amount from the heat-generating element 100 increases, the heat inputted in the evaporation portion 41 can be equalized, and thermal resistance in the evaporation portion 41 can be reduced. In the heat sink 1, since the entire internal space of the heat transport member 10 is integrated in a communicating manner, the entire heat-generating element 100 can be uniformly cooled even when heat generation unevenness occurs in the heat-generating element 100.

In the heat sink 1, since the tube body 31 has the inclined portion 39 that inclines from the flat portion 37 toward the circular portion 36, between the circular portion 36 and the flat portion 37, the liquid-phase working fluid circulates more smoothly from the tube body 31 to the heat transport member 10, and circulation characteristics of the liquid-phase working fluid from the tube body 31 to the heat transport member 10 are further improved.

In the heat sink 1, since the heat transport member 10 is a planar type that extends on the same plane, the space for the heat transport member 10 is saved, in particular, the space is saved in the thickness direction of the heat transport member 10, and the heat sink 1 can be installed in even a narrow space.

Figure 6:
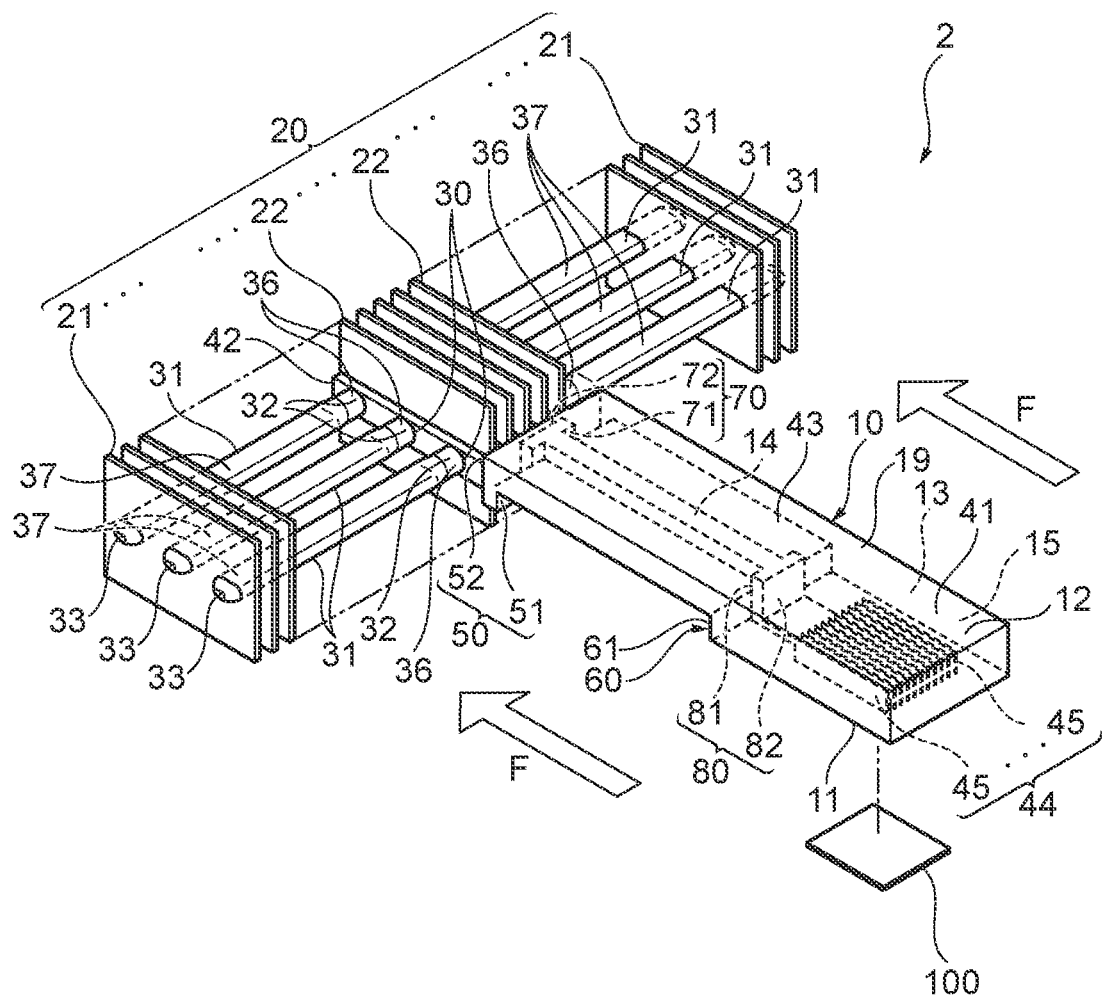
FIG. 6 is a perspective view explaining an outline of a heat sink according to a second embodiment of the present disclosure.
Figure 7:
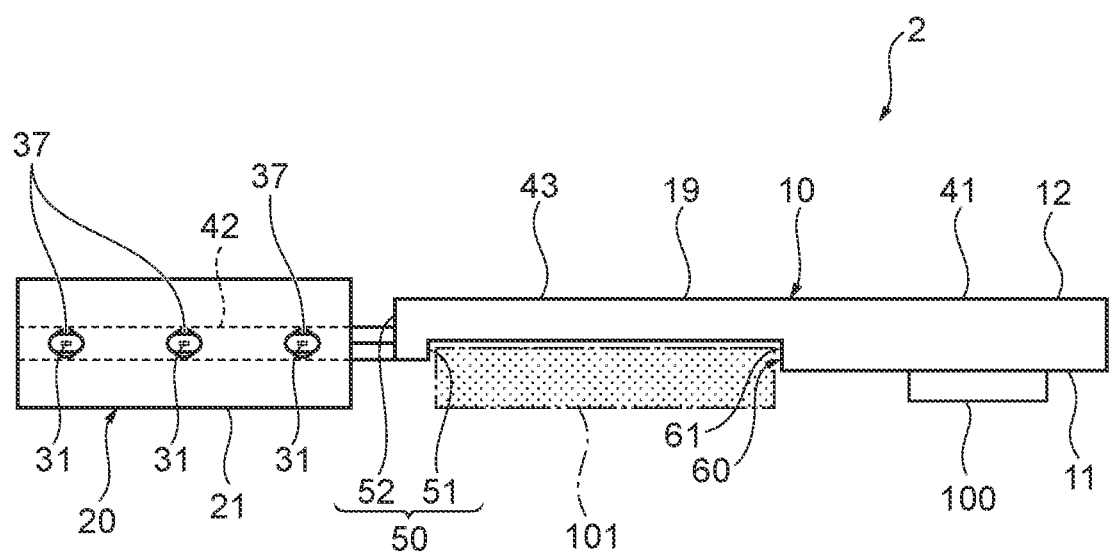
FIG. 7 is a side view explaining an outline of the heat sink according to the second embodiment of the present disclosure.
Figure 8:
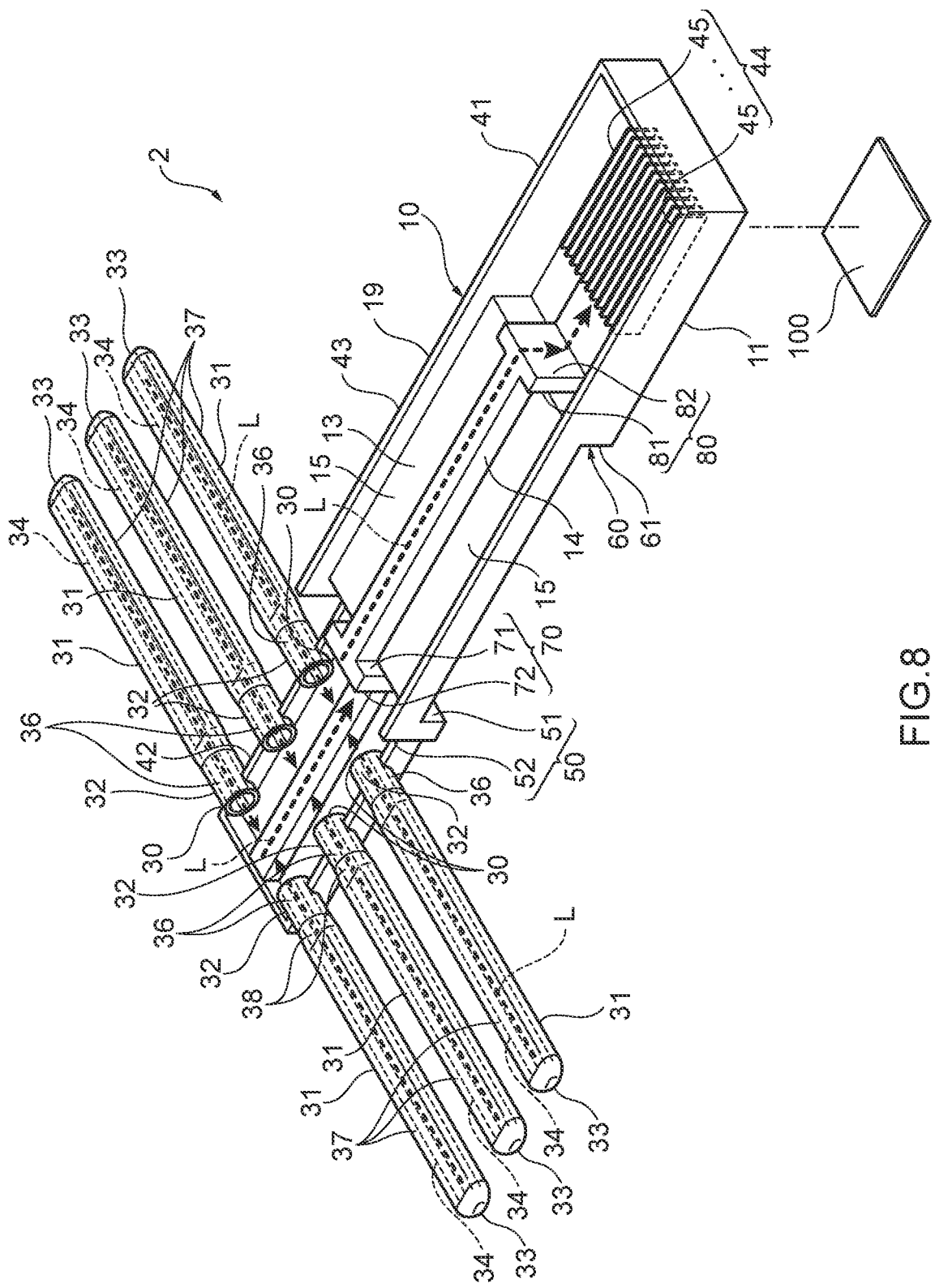
FIG. 8 is a perspective view explaining an outline of an inside of the heat sink according to the second embodiment of the present disclosure.
Figure 9:
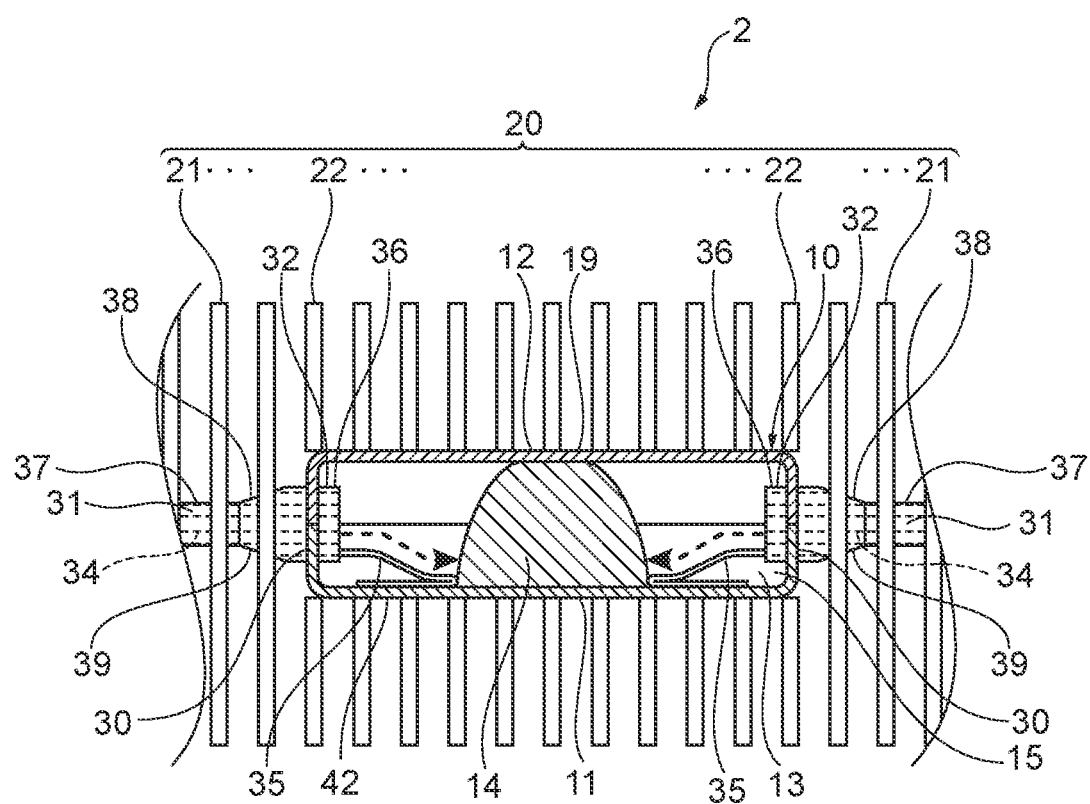
FIG. 9 is an explanatory view illustrating an outline of a connection portion between a heat transport member and a tube body of the heat sink according to the second embodiment of the present disclosure.
Figure 10:
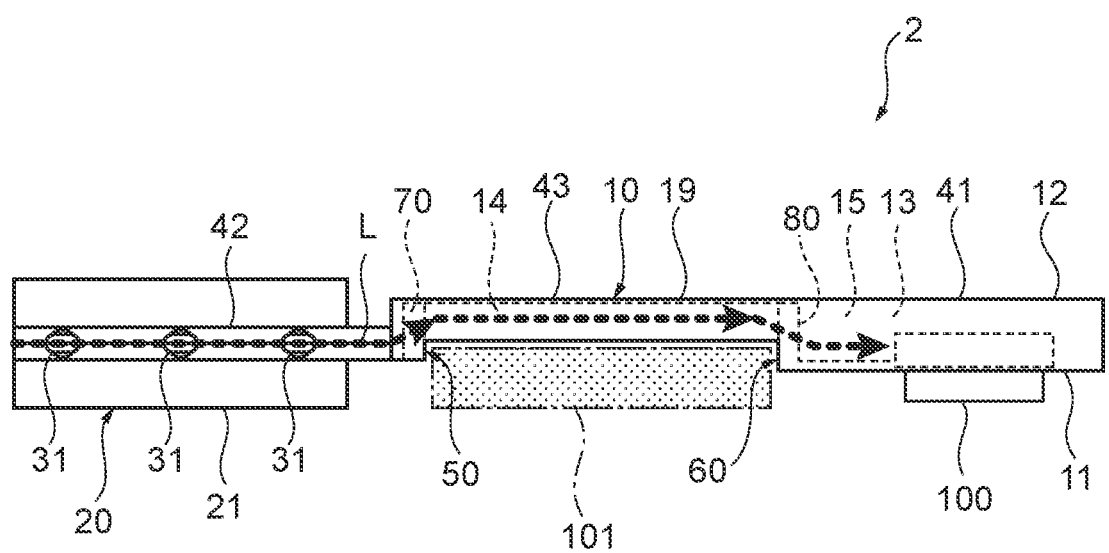
FIG. 10 is a side view explaining the outline of the inside of the heat sink according to the second embodiment of the present disclosure.

Thereafter, a heat sink according to a second embodiment of the present disclosure will be described with reference to the drawings. Since the main parts of the heat sink according to the second embodiment are the same as those of the heat sink according to the first embodiment, the same components will be described using the same reference numerals. FIG. 6 is a perspective view explaining an outline of a heat sink according to the second embodiment of the present disclosure. FIG. 7 is a side view explaining the outline of the heat sink according to the second embodiment of the present disclosure. FIG. 8 is a perspective view explaining an outline of an inside of the heat sink according to the second embodiment of the present disclosure. FIG. 9 is an explanatory view illustrating an outline of a connection portion between a heat transport member and a tube body of the heat sink according to the second embodiment of the present disclosure. FIG. 10 is a side view explaining the outline of the inside of the heat sink according to the second embodiment of the present disclosure.

In the heat sink 1 according to the first embodiment, a planar type heat transport member extending on the same plane is used as the heat transport member 10, but instead of the planar type heat transport member, as illustrated in FIGS. 6 to 8, in a heat sink 2 according to the second embodiment, a heat transport member 10 has a heat radiation side step portion 50 provided with a step in a direction that is not a parallel direction to the heat transport direction of the heat transport member 10, between a heat insulating portion 43 located between an evaporation portion 41 and a condensation portion 42, and the condensation portion 42.

In the heat sink 2, the heat radiation side step portion 50 has a step in a direction substantially orthogonal to the heat transport direction of the heat transport member 10. The heat radiation side step portion 50 has a step in a direction substantially perpendicular to an installation surface of the heat sink 2. By having the heat radiation side step portion 50, the heat sink 2 can be installed even when a forbidden region 101 exists in an installation space in a vicinity of the condensation portion 42, under an environment where the installation space for the heat sink 2 is limited.

The heat radiation side step portion 50 is formed of a step portion 51 that is a step provided at one plate-shaped body 11 and in a direction substantially orthogonal to the heat transport direction of the heat transport member 10, and a step portion 52 that is a step provided at another plate-shaped body 12 and is in a direction substantially orthogonal to the heat transport direction of the heat transport member 10. Accordingly, in the one plate-shaped body 11, the heat insulating portion 43 and the condensation portion 42 are not located on the same plane. In the other plate-shaped body 12, the heat insulating portion 43 and the condensation portion 42 are not located on the same plane.

As illustrated in FIGS. 6 to 8, in the heat sink 2, the heat transport member 10 has a heat receiving side step portion 60 provided with a step in a direction that is not a parallel direction to the heat transport direction of the heat transport member 10, between the evaporation portion 41 and the heat insulating portion 43.

In the heat sink 2, the heat receiving side step portion 60 has a step in a direction substantially orthogonal to the heat transport direction of the heat transport member 10. The heat receiving side step portion 60 has the step in a direction substantially perpendicular to an installation surface of the heat sink 2. By having the heat receiving side step portion 60, the heat sink 2 can be installed even when the forbidden region 101 exists in the installation space in the vicinity of the evaporation portion 41, under the environment where the installation space for the heat sink 2 is limited.

The heat receiving side step portion 60 is formed of a step portion 61 that is the step provided at the one plate-shaped body 11 and in the direction substantially orthogonal to the heat transport direction of the heat transport member 10. At the other plate-shaped body 12, a step forming the heat receiving side step portion 60 is not provided. Accordingly, in the one plate-shaped body 11, the heat insulating portion 43 and the evaporation portion 41 are not located on the same plane. Meanwhile, in the other plate-shaped body 12, the heat insulating portion 43 and the evaporation portion 41 are located on the same plane.

As illustrated in FIGS. 6 and 8, in the heat sink 2, a first wick structure 14 has a first step portion 70 that follows the step of the heat radiation side step portion 50. In other words, the first step portion 70 is provided at a part between the heat insulating portion 43 and the condensation portion 42 of the heat transport member 10, of the first wick structure 14. A step of the first step portion 70 is provided in a direction that is not a parallel direction to the heat transport direction of the heat transport member 10. In the heat sink 2, the first step portion 70 has a step in the direction substantially orthogonal to the heat transport direction of the heat transport member 10 correspondingly to the heat radiation side step portion 50 that has the step in the direction substantially orthogonal to the heat transport direction of the heat transport member 10. Further, the first step portion 70 has the step in the direction substantially perpendicular to the installation surface of the heat sink 2 correspondingly to the heat radiation side step portion 50 that has the step in the substantially perpendicular direction to the installation surface of the heat sink 2. Furthermore, the first step portion 70 has the step in the direction to the installation surface of the heat sink 2 from the heat insulating portion 43 toward the condensation portion 42 correspondingly to the heat radiation side step portion 50 that has the step in the direction to the installation surface of the heat sink 2 from the heat insulating portion 43 toward the condensation portion 42.

The first step portion 70 is formed of a step portion 71 that is a step that is provided on a heat insulating portion 43 side and is in the direction substantially orthogonal to the heat transport direction of the heat transport member 10, and a step portion 72 that is a step that is provided on a condensation portion 42 side and is in the direction substantially orthogonal to the heat transport direction of the heat transport member 10. Accordingly, in the first wick structure 14, a part located in the heat insulating portion 43 and a part located in the condensation portion 42 are not located on a same plane, on the side of the one plate-shaped body 11. Further, in the first wick structure 14, the part located in the heat insulating portion 43 and the part located in the condensation portion 42 are not located on the same plane, either, on the side of the other plate-shaped body 12. From the above, in the first wick structure 14, the part located in the condensation portion 42 is located closer to the installation surface side of the heat sink 2 than the part located in the heat insulating portion 43.

As illustrated in FIGS. 6 and 8, the first wick structure 14 has a second step portion 80 that follows the step of the heat receiving side step portion 60. In other words, the second step portion 80 is provided in a part between the heat insulating portion 43 and the evaporation portion 41 of the heat transport member 10. A step of the second step portion 80 is provided in the direction that is not the parallel direction to the heat transport direction of the heat transport member 10. In the heat sink 2, the second step portion 80 has a step in the direction substantially orthogonal to the heat transport direction of the heat transport member 10 correspondingly to the heat receiving side step portion 60 that has the step in the direction substantially orthogonal to the heat transport direction of the heat transport member 10. Further, the second step portion 80 has the step in the direction substantially perpendicular to the installation surface of the heat sink 2 correspondingly to the heat receiving side step portion 60 that has the step in the direction substantially perpendicular to the installation surface of the heat sink 2. Furthermore, the second step portion 80 has the step in the direction to the installation surface of the heat sink 2 from the heat insulating portion 43 to the evaporation portion 41 correspondingly to the heat receiving side step portion 60 that has the step in the direction to the installation surface of the heat sink 2 from the heat insulating portion 43 toward the evaporation portion 41.

The second step portion 80 is formed of a step portion 81 that is a step that is provided on the side of the heat insulating portion 43 and in the direction substantially orthogonal to the heat transport direction of the heat transport member 10, and a step portion 82 that is a step that is provided on the side of the evaporation portion 41 and in the direction substantially orthogonal to the heat transport direction of the heat transport member 10. Accordingly, in the first wick structure 14, on the side of the one plate-shaped body 11, a part located in the heat insulating portion 43 and a part located in the evaporation portion 41 are not located on the same plane. Further, in the first wick structure 14, on the side of the other plate-shaped body 12, the part located in the heat insulating portion 43 and the part located in the evaporation portion 41 are not located on the same plane, either. From the above, the first wick structure 14 is located closer to the installation surface side of the heat sink 2 than the part located in the heat insulating portion 43.

As illustrated in FIGS. 6 to 8, in the heat sink 2, a tube body 31 also has a circular portion 36 in which a shape in a direction (for example, radial direction) orthogonal to a longitudinal direction is a circular shape, and a flat portion 37 in which a shape in a direction (for example, radial direction) orthogonal to the longitudinal direction is a flat shape. The circular portion 36 of the tube body 31 is located in a connection portion 30 with the heat transport member 10, and the flat portion 37 of the tube body 31 is located in a part to which a plurality of heat radiation fins 21, 21, 21 . . . are thermally connected.

As illustrated in FIG. 9, in the heat sink 2, in the tube body 31, a boundary portion 38 between the circular portion 36 and the flat portion 37 is also an inclined portion 39 inclined in a slope shape from the flat portion 37 toward the circular portion 36.

As illustrated in FIG. 9, in the heat sink 2, the first wick structure 14 provided in the heat transport member 10 may also be connected to a second wick structure 34 provided in the tube body 31, via a connection member 35 located in the connection portion 30.

As illustrated in FIG. 10, in the heat sink 2, since the first wick structure 14 has the first step portion 70 that follows the step of the heat radiation side step portion 50 and the second step portion 80 that follows the step of the heat receiving side step portion 60, a working fluid L that has changed in phase to a liquid phase at the other end of the container 19 can circulate from the other end of the container 19 to the one end of the container 19 by flowing through the heat radiation side step portion 50 and the heat receiving side step portion 60 by a capillary force of the first wick structure 14, even when the heat transport member 10 has the heat radiation side step portion 50 and the heat receiving side step portion 60 in order to avoid the forbidden region 101.

In the heat sink 2, since the tube body 31 has the circular portion 36 in which the shape in the radial direction is a circular shape, and the flat portion 37 in which the shape in the radial direction is a flat shape, and the circular portion 36 is located in the connection portion 30 with the heat transport member 10, pressure loss of the gas-phase working fluid in the connection portion 30 is also reduced, and flow characteristics of the gas-phase working fluid are excellent. Since the shape in the radial direction of the tube body 31 in the connection portion 30 is the circular shape, intervals among the tube bodies 31 can be sufficiently ensured in base portions 32 of the tube bodies 31 located in the connection portions 30, even when the number of tube bodies 31 installed is increased to improve cooling characteristics of the heat sink 1. Therefore, it is possible to prevent cracking from occurring in the heat transport member 10 in the part between the tube body 31 and the tube body 31 due to contact or the like of the tube body 31 and the heat transport member 10 while obtaining excellent cooling performance.

Next, another embodiment of the heat sink of the present disclosure will be descried hereinafter. In the heat sink of each of the above-descried embodiments, the first wick structure 14 is connected to the second wick structure 34 via the connection member 35 located in the connection portion 30, but the connection member 35 does not have to be provided, and the first wick structure 14 may be connected to the second wick structure 34 without aid of the connection member 35.

The heat sink of the present disclosure is excellent in flow characteristics of the gas-phase working fluid and cooling performance while saving space, and also can prevent leak-age of the gas-phase working fluid. Therefore, the heat sink of the present disclosure is highly useful in the field of cooling, for example, an electronic component having a high heat generation amount, for example, an electronic component such as a central processing unit, placed on a circuit board installed in a narrow space.

What is claimed is:

1. A heat sink comprising:
   a heat transport member having an evaporation portion to be thermally connected to a heat-generating element;
   a plurality of tube bodies which are connected to a connection portion located in a condensation portion of the heat transport member and have a heat transport direction different from a heat transport direction of the heat transport member; and
   a heat radiation fin group which is thermally connected to the plurality of tube bodies and in which a plurality of heat radiation fins are arranged, wherein
   the heat transport member has an integral internal space which communicates from the evaporation portion to the connection portion with the plurality of tube bodies and in which a working fluid is sealed, and the internal space of the heat transport member communicates with an internal space of the tube body via the connection portion,
   each of the tube bodies of the plurality of tube bodies has a circular portion in which a shape in a radial direction is a circular shape, and a flat portion in which a shape in the radial direction is a flat shape,
   the circular portion is located in the connection portion, and the flat portion is located in a part to which the heat radiation fin group is thermally connected,
   the plurality of tube bodies are connected to a container of the heat transport member at the connection portion by a joining material,
   a second wick structure is provided inside said each of the tube bodies, and an entire inner surface of the flat portion is covered with the second wick structure, and
   the tube bodies are solely aligned in the longitudinal direction of the flat portion.

2. The heat sink according to claim 1, wherein
   a first wick structure extending from the evaporation portion to the condensation portion is provided in the internal space of the heat transport member.

3. The heat sink according to claim 2, wherein
   the first wick structure is connected to the second wick structure via a connection member located in the connection portion.

4. The heat sink according to claim 3, wherein
   the connection member is a wick member having a capillary force.

5. The heat sink according to claim 1, wherein
   said each of the tube bodies has an inclined portion that inclines from the flat portion to the circular portion, between the circular portion and the flat portion.

6. The heat sink according to claim 2, wherein
   said each of the tube bodies has an inclined portion that inclines from the flat portion to the circular portion, between the circular portion and the flat portion.

7. The heat sink according to claim 3, wherein
   said each of the tube bodies has an inclined portion that inclines from the flat portion to the circular portion, between the circular portion and the flat portion.

8. The heat sink according to claim 4, wherein
   said each of the tube bodies has an inclined portion that inclines from the flat portion to the circular portion, between the circular portion and the flat portion.

9. The heat sink according to claim 1, wherein the heat transport member is a planar type that extends on a same plane.

10. The heat sink according to claim 1, wherein the heat transport member has a heat radiation side step portion provided with a step in a direction that is not a direction parallel to the heat transport direction of the heat transport member, between a heat insulating portion located between the evaporation portion and the condensation portion, and the condensation portion.

11. The heat sink according to claim 2, wherein the heat transport member has a heat radiation side step portion provided with a step in a direction that is not a direction parallel to the heat transport direction of the heat transport member, between a heat insulating portion located between the evaporation portion and the condensation portion, and the condensation portion.

12. The heat sink according to claim 3, wherein the heat transport member has a heat radiation side step portion provided with a step in a direction that is not a direction parallel to the heat transport direction of the heat transport member, between a heat insulating portion located between the evaporation portion and the condensation portion, and the condensation portion.

13. The heat sink according to claim 4, wherein the heat transport member has a heat radiation side step portion provided with a step in a direction that is not a direction parallel to the heat transport direction of the heat transport member, between a heat insulating portion located between the evaporation portion and the condensation portion, and the condensation portion.

14. The heat sink according to claim 1, wherein the heat transport member has a heat receiving side step portion provided with a step in a direction that is not a direction parallel to the heat transport direction of the heat transport member, between the evaporation portion and the heat insulating portion.

15. The heat sink according to claim 2, wherein the heat transport member has a heat receiving side step portion provided with a step in a direction that is not a direction parallel to the heat transport direction of the heat transport member, between the evaporation portion and the heat insulating portion.

16. The heat sink according to claim 3, wherein the heat transport member has a heat receiving side step portion provided with a step in a direction that is not a direction parallel to the heat transport direction of the heat transport member, between the evaporation portion and the heat insulating portion.

17. The heat sink according to claim 4, wherein the heat transport member has a heat receiving side step portion provided with a step in a direction that is not a direction parallel to the heat transport direction of the heat transport member, between the evaporation portion and the heat insulating portion.

18. The heat sink according to claim 1, wherein said each of the tube bodies extends along an arrangement direction of the plurality of heat radiation fins.

19. The heat sink according to claim 1, wherein the plurality of the tube bodies are provided and extend in a plurality of directions from the heat transport member.

20. The heat sink according to claim 5, wherein at least one of the heat radiation fins is thermally connected to the inclined portion.

21. The heat sink according to claim 1, wherein an overall shape in the longitudinal direction of said each of the tube bodies is rectilinear.

22. The heat sink according to claim 1, wherein in an internal space of said each of the tube bodies, a ratio of a diameter of the circular portion and a thickness of the flat portion of said each of the tube bodies is 0.30 to 0.90.

* * * * *